(12) United States Patent
Kinsley (10) Patent No.: US 11,403,238 B2
(45) Date of Patent: Aug. 2, 2022

(54) CONFIGURABLE DATA PATH FOR MEMORY MODULES

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 249 days.

(21) Appl. No.: 16/715,183

(22) Filed: Dec. 16, 2019

(65) Prior Publication Data

US 2020/0210352 A1 Jul. 2, 2020

Related U.S. Application Data

(60) Provisional application No. 62/787,039, filed on Dec. 31, 2018.

(51) Int. Cl.
| | |
|---|---|
| *G11C 29/00* | (2006.01) |
| *G06F 13/16* | (2006.01) |
| *G06F 11/10* | (2006.01) |
| *G11C 11/406* | (2006.01) |
| *G11C 11/4076* | (2006.01) |
| *G11C 11/4093* | (2006.01) |

(52) U.S. Cl.
CPC ...... *G06F 13/1668* (2013.01); *G06F 11/1004* (2013.01); *G06F 11/1068* (2013.01); *G11C 11/406* (2013.01); *G11C 11/4076* (2013.01); *G11C 11/4093* (2013.01)

(58) Field of Classification Search
CPC ............ G06F 13/1668; G06F 11/1068; G06F 11/1004; G11C 11/406; G11C 11/4076; G11C 11/4093
See application file for complete search history.

(56) References Cited

U.S. PATENT DOCUMENTS

| | | |
|---|---|---|
| 6,681,301 B1 | 1/2004 | Mehta et al. |
| 2006/0267172 A1 | 11/2006 | Nguyen et al. |
| 2013/0182522 A1 | 7/2013 | Lim et al. |
| 2014/0003178 A1* | 1/2014 | Song ................ G11C 11/40611 365/222 |
| 2016/0034340 A1 | 2/2016 | Dono et al. |
| 2017/0337125 A1* | 11/2017 | Lee .......................... G11C 5/04 |
| 2018/0285013 A1 | 10/2018 | Rajan et al. |
| 2019/0007168 A1* | 1/2019 | Shih .................... G06F 13/1668 |
| 2021/0271593 A1* | 9/2021 | Lee .......................... G11C 8/12 |

OTHER PUBLICATIONS

International Application No. PCT/US2019/066635—International Search Report and Written Opinion, dated Apr. 17, 2020, 11 pages.

\* cited by examiner

*Primary Examiner* — Samir W Rizk
(74) *Attorney, Agent, or Firm* — Perkins Coie LLP (57) ABSTRACT

Systems and methods are described to enable a memory device integrated in a memory module or system to disable one or more data bits, nibbles or bytes of the memory device. The memory device can be further configured to disable error or redundancy checking associated with the disabled data bits, nibbles or bytes, to mask errors associated with the disabled data bits, nibbles or bytes, and/or to suppress the refresh of portions of a memory array associated with the disabled data bits, nibbles or bytes.

18 Claims, 5 Drawing Sheets

CONFIGURABLE DATA PATH FOR MEMORY MODULES

CROSS-REFERENCE TO RELATED APPLICATION(S)

This application claims the benefit of U.S. Provisional Application No. 62/787,039, filed Dec. 31, 2018; which is incorporated herein by reference in its entirety.

TECHNICAL FIELD

The present disclosure generally relates to semiconductor memory devices, and more particularly relates to systems and methods for a configurable data path for memory modules or systems where memory is used.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random-access memory (SRAM), dynamic random-access memory (DRAM), and synchronous dynamic random-access memory (SDRAM), among others, can require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, can include increasing memory cell density, increasing read/write speeds or otherwise reducing operational latency, increasing reliability, increasing data retention, reducing power consumption, or reducing manufacturing costs, among other metrics.

DETAILED DESCRIPTION

Data paths that can transmit multiple bits in parallel are frequently used to facilitate the rapid transfer of information into and out of memory devices. By integrating multiple such memory devices into a memory package, memory module, or the like, a wide data bus can be provided (e.g., with a number of bits equal to the sum of the data path width of each of the constituent memory devices). Some memory modules and/or memory packages may be constrained (e.g., by a manufacturing or industry standard) to use a data bus with a predetermined number of bits. If the constituent memory devices provide more bandwidth than necessary to fully populate the data bus, or more bits than are required by the application, at least some of the memory devices will have unused data paths. The power consumed by the circuits corresponding to these unused data paths can still contribute to the total power consumption of the memory module or memory package.

To overcome this and other challenges, systems and methods for a configurable data path for memory modules, including dual-inline memory modules (DIMMs) and/or systems where memory is used, are disclosed herein. The disclosed systems and methods provide a mechanism to configure the data path of memory devices by disabling at least a portion thereof (e.g., in response to a host command, a mode register setting, or a configuration made by the manufacturer during the packaging/assembly thereof). In one embodiment, the configuration of the data path can also involve disabling an Error Correcting Code (ECC) or Cyclic Redundancy Check (CRC) feature, to prevent the disabled portion of the data path from triggering inaccurate error detections.

As will be discussed further below, elements of the presently disclosed technology described in the context of particular paragraphs and/or Figures can be combined with elements described in the context of other paragraphs and/or Figures. Furthermore, not all elements of the technology disclosed herein are required to practice the technology. Additionally, several details describing structures and/or processes that are well-known and often associated with memory devices, but that may unnecessarily obscure some significant aspects of the present technology, are not set forth in the following description for purposes of clarity. Moreover, although the following disclosure sets forth several embodiments of the present technology, several other embodiments of the technology have different configurations or different components than those described in this section. As such, the present technology can have other embodiments, with additional elements and/or without several of the elements described below with reference to the figures.

Figure 1:
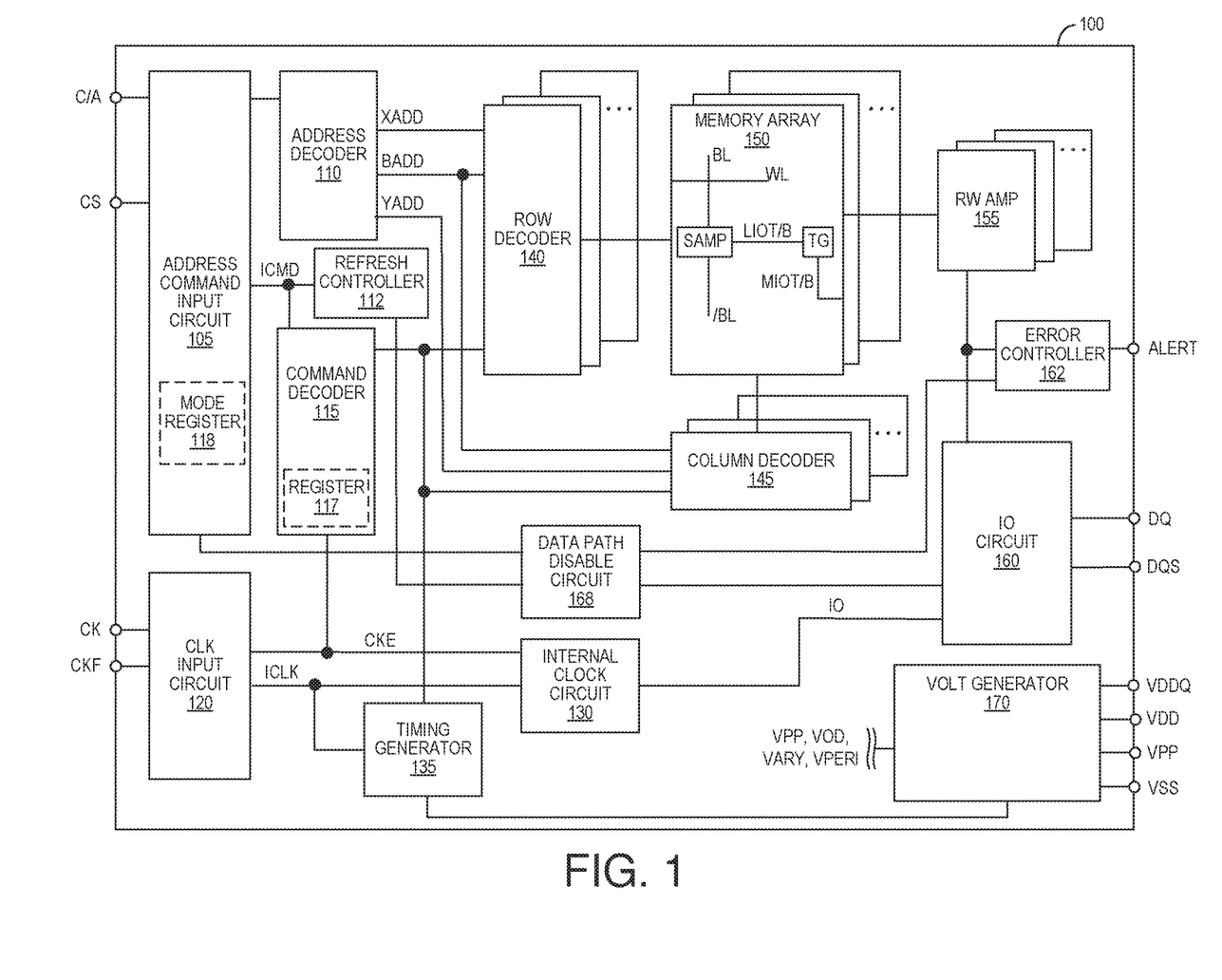
FIG. 1 is a representative block diagram schematically illustrating a memory device.

FIG. 1 is a block diagram schematically illustrating a memory device 100 in accordance with an embodiment of the present technology. The memory device 100 can include an array of memory cells, such as memory array 150. The memory array 150 can include a plurality of banks, and each bank can include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL can be performed by a row decoder 140, and the selection of a bit line BL can be performed by a column decoder 145. Sense amplifiers (SAMP) can be provided for corresponding bit lines BL and connected to at least one respective local I/O line pair (LIOT/B), which can in turn be coupled to at least respective one main I/O line pair (MIOT/B), via transfer gates (TG), which can function as switches. The memory array 150 can also include plate lines and corresponding circuitry for managing their operation.

The memory device 100 can employ a plurality of external terminals that include command and address terminal (C/A) coupled to a command bus and an address bus to receive command signals (CMD) and address signals (ADDR). The memory device can further include a chip select terminal to receive a chip select signal CS, clock terminals to receive clock signals CK and CKF, data terminals DQ and DQS, power supply terminals VDD, VSS, VDDQ, and VPP.

The command and address terminal (C/A) can be supplied with an address signal and a bank address signal. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command/address input circuit 105 can be supplied with command and address signals C/A, and chip selection signals CS, from a memory controller. The command signals can represent various memory commands from the memory controller (e.g., including access commands, which can include read and write commands, and refresh commands). The select signal CS can be used to select the memory device 100 to respond to commands and addresses provided to the command and address terminal. When an active CS signal is provided to the memory device 100, the commands and addresses can be decoded and memory operations can be performed. The command signals CMD can be provided as internal command signals ICMD to a command decoder 115 via the command/address input circuit 105. The command decoder 115 can include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 can further include one or more registers 117 for tracking various counts or values (e.g., counts of refresh commands received by the memory device 100 or self-refresh operations performed by the memory device 100).

The memory device 100 can also include a data path disable circuit 168 to disable a portion of the data path and disable functionality associated with the disabled data path. For example, in some embodiments further described in relation to FIGS. 2-4 below, the data path disable circuit 168 employs a bit or bits programmed in mode register 118 (or other signals as described later), to cause the I/O circuit 160 to disable one or more nibbles of DQ, and when one byte is disabled, to disable the data strobe associated with the disabled byte, e.g., DQSU. The data path disable circuit 168 can also disable the Cyclic Redundancy Check (CRC) code and ECC functionality associated with the disabled data path portion, for example, by masking or suppressing any ECC or CRC errors associated with the disabled data portion and suppressing the activation of an error alert signal, e.g., ALERT from error controller 162. The data path disable circuit 168 can also cause the refresh controller 112 to skip the refresh of portions of memory array 150 associated with the disabled data and/or mask any ECC errors generated from such refresh operations.

When a read command is issued and a row address and a column address are timely supplied with the read command, read data can be read from memory cells in the memory array 150 designated by these row address and column address. The read command can be received by the command decoder 115, which can provide internal commands to input/output circuit 160 so that read data can be output from the data terminals DQ and DQS via read/write amplifiers 155 and the input/output circuit 160 according to the DQS strobe signals.

When a write command is issued and a row address and a column address are timely supplied with the command, write data can be supplied to the data terminals. The write command can be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data can be written in the memory cell designated by the row address and the column address. The write data can be provided to the data terminals at a time that is defined by write latency WL information. The write latency WL information can be programmed in the memory device 100, for example, in the mode register 118. The write latency WL information can be defined in terms of clock cycles of the CK clock signal. For example, the write latency information WL can be a number of clock cycles of the CK signal after the write command is received by the memory device 100 when the associated write data is received.

In some embodiments further described in relation to FIGS. 2-4 below, the data path disable circuit 168 can disable a portion of the data terminals DQ and DQS based on a value of a field in mode register 118 or in response to a command from a connected host device. For example, as discussed further in relation to FIG. 3, for X16 SDRAM memory devices (with 16-bit data bus DQ) used in DIMMS or systems with a 40-bit data bus per channel, mode register 118 can include a path disable bit which when set can cause the data path disable circuit 168 to cause the I/O circuit 160 to disable an upper byte of the data bus DQ. The data path disable circuit 168 can also cause the I/O circuit 160 to disable an upper data strobe DQSU associated with the disabled upper byte. The DIMM or system can employ three X16 SDRAMs, with one of the three SDRAMs having the path disable bit in mode register 118 set so that the upper byte of that third SDRAM is disabled resulting in 40-bits of output data DQ (i.e., 16 bits each for two of the SDRAMs, and 8 bits for the third).

The power supply terminals can be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal can also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

Input buffers included in the clock input circuit 120 can receive the external clock signals. For example, an input buffer can receive the CK and CKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 can be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device can be a networking device (e.g., a switch, a router, etc.) or a recorder of digital images, audio and/or video, a vehicle, an appliance, a toy, or any one of a number of other products. In one embodiment, the host device can be connected directly to memory device 100, although in other embodiments, the host device can be indirectly connected to memory device (e.g., over a networked connection or through intermediary devices).

Figure 2:
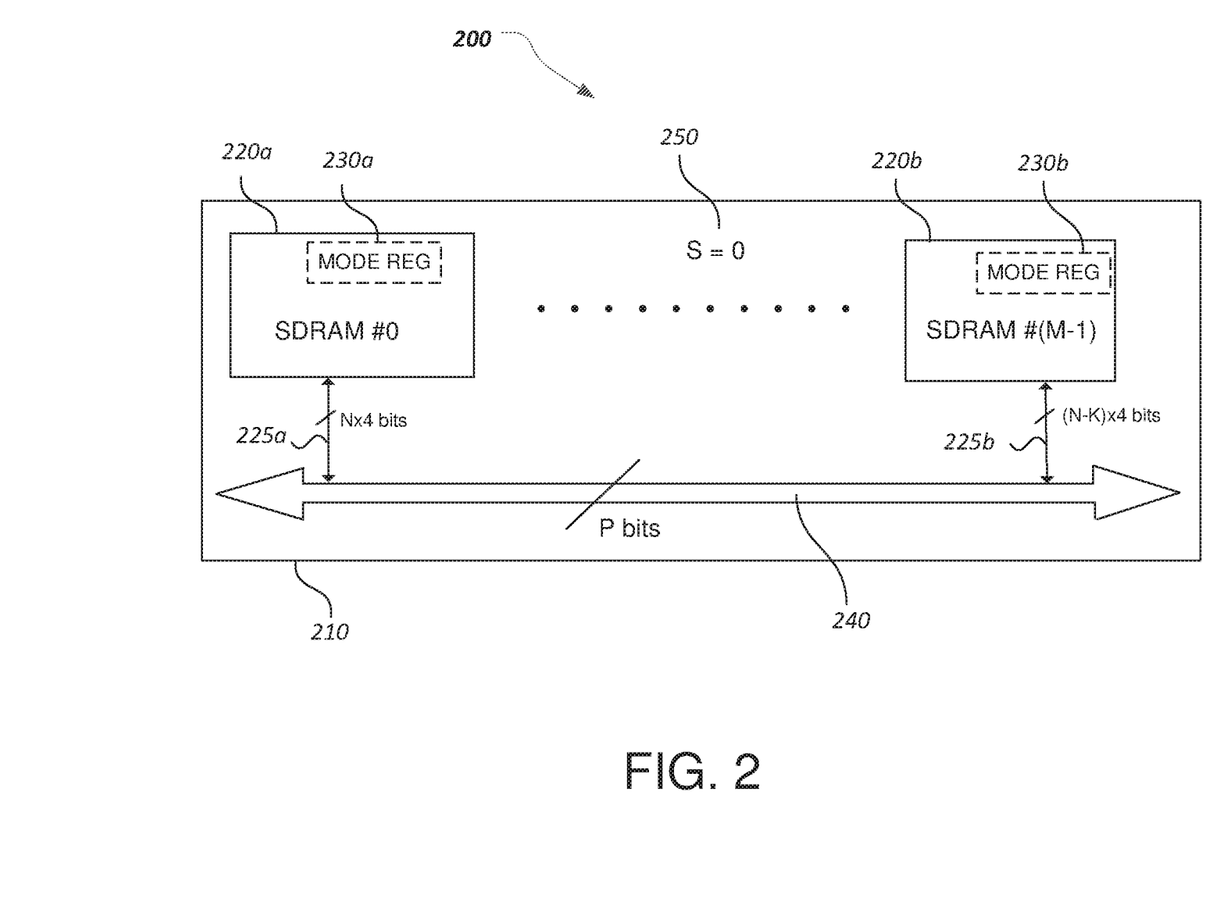
FIG. 2 is a representative block diagram schematically illustrating a configurable data path for a memory module.

FIG. 2 is a representative block diagram 200 schematically illustrating a configurable data path for a memory module 210. Memory module 210 integrates M SDRAM memory devices per channel 250; FIG. 2 depicts two instances of the memory device 100 of FIG. 1, memory device #0 220a, and memory device #(M−1) 220b, integrated in channel (S=0) 250. Each memory device 220a and 220b includes a number of data terminals or bits (DQ), the number depending on the position of the memory device in the memory module 210, among other factors discussed below. For example, memory device #0 220a includes N×4 data bits 225a, and memory device #(M−1) 220b include (N−K)×4 data bits 225b, where K is a number of nibbles of data bits disabled from memory device #(M−1) 220b as described below. Memory module 210 also includes a P-bit data bus 240 coupled to the bits of each memory device. That is, memory device 220a's N×4 bits and memory device 220b's (N−K)×4 bits couple to the P-bit data bus 240, and, in the example where these are the only two memory devices in the memory module or system, P would be equal to (N×4)+((N−K)×4) bits. In some embodiments, only the non-disabled bits such as the (N−K)×4 data bits 225b of memory device 220b are coupled to the data bus 240 while the disabled K×4 bits are left unconnected or held at a static voltage. In other embodiments, all the data bits of all the integrated memory devices are coupled to the data bus 240 although the disabled K×4 data bits can be internally deactivated.

The memory devices 220a and 220b include a different number of data bits (DQ) in different embodiments. For example, x4 devices include 4 data bits (1 data nibble), x8 devices include 8 data bits (2 data nibbles), x16 devices include 16 data bits (2 data bytes or 4 data nibbles), and x32 devices include 32 data bits (4 data bytes or 8 data nibbles). As discussed above, N can represent the number of data nibbles in the data bits of the memory devices, therefore, in some examples, if memory device 220a is configured as a x4 device, N=1 and data bits 225a is equal to 4 bits; in other examples, if configured as a x8 device, N=2 and data bits 225a is equal to 8 bits; in other examples, if configured as a x16 device, N=4 and data bits 225a is equal to 16 bits; and in other examples, if configured as a x32 device, N=8 and data bits 225a is equal to 32 bits.

In some embodiments the number of data bits P in data bus 240 can be 32 bits when ECC is not enabled, and the number of data bits P in the data bus 240 can be 36 bits, 40 bits, or otherwise as required by the system when ECC is enabled. Typically, there is 1 ECC bit for every 8 bits (byte) of data bits. For dual-channel memory modules without ECC, data bus 240 can be 64 bits; for dual-channel memory modules with ECC, data bus 240 can be 72 bits, 80 bits, or otherwise where 8 bits can be used for error correction. The DRAM configuration can be set via mode register 118 (FIG. 1), fuse blow configuration during factory test, or external voltage level on die pad or package pin(s).

For example, in embodiments with ECC enabled and data bus 240 is 72 bits, if x4 memory devices are used in memory module 210 (x4 memory devices have 1 nibble of data bits so N=1), nine memory devices can be used to populate each channel of memory module 210, i.e., M=9. Nine memory devices with 4 data bits each (1 data nibble each) would result in 36 bits per channel (M*N*4=9*1*4=36). For such an example where nine memory devices provide all the data and ECC bits needed per channel of the dual-channel memory module 210, no additional memory modules would be needed, hence K=0 (no nibbles to disable because no additional memory modules are needed in such a scenario).

In embodiments where x16 memory devices are used in memory module 210 (x16 memory devices have 4 data nibbles so N=4), three memory devices can be used to populate each channel of memory module 210, i.e., M=3. Three memory devices with 16 data bits each (4 data nibbles each) results in 48 bits per channel (M*N*4=3*4*4=48). If, for example, the memory devices are used in a DIMM or system with a 36-bit data bus per channel with ECC enabled, 12 bits (3 nibbles) of one of the three memory devices can be disabled, hence K=3. The number of data bits available after three nibbles of one memory device are disabled is given by ((M*N)−K)*4=((3*4)−3)*4=36 bits. If, instead, the memory devices are used in a DIMM or system with a 40-bit data bus per channel, 8 bits (2 nibbles or 1 byte) of one of the three memory devices can be disabled, hence K=2. The number of data bits available after two nibbles of one memory device are disabled is given by ((M*N)−K)*4=((3*4)−2)*4=40 bits. This is discussed further below in relation to FIG. 3.

In other embodiments, different relationships or values can be used. For example, where x32 memory devices are used in a DIMM or system with a 36-bit data bus per channel, M=2 (two X32 modules employed), N=8 (each X32 memory device has eight nibbles), and K=7 (seven nibbles disabled from one memory device). That is, given the number of data nibbles of each memory device used in memory module 210 (where each memory device has the same number of data nibbles), the data bits P of data bus 240 can be satisfied by the equation: P=4*((M*N)−K), where M is the number of N-data-nibble memory devices used in the memory module, and K is the number of nibbles that can be disabled from the data nibbles of one of the M memory devices.

Each memory device 100 can include path disable bit(s) in the mode register 118 as discussed in relation to FIG. 1 above. To simplify the discussion that follows, memory device 220a's mode register is denoted as 230a in FIG. 2, and memory device 220b's mode register is denoted as 230b. The mode registers 230a and 230b can include one or more bits to determine which data nibbles to disable, if any, in respective memory device 220a and 220b. In some embodiments, mode registers 230a and 230b include a byte disable bit which when set can disable an upper byte of the data DQ and upper data strobe DQSU as well as mask ECC and CRC error alerts as discussed above in relation to FIG. 1. In other embodiments, mode registers 230a and 230b can include several bits to indicate which nibble to disable (and to mask ECC/CRC errors associated with those disabled nibbles). For example, a X16 memory device can include 2-bit data path disable bits in mode register 118 to indicate which one of 4 nibbles to disable. For example, a data path disable bit setting of 1′b00 can indicate not to disable any nibbles (e.g., mode register path disable field setting for first two X16 memory devices in the 40-bit channel shown in FIG. 3); 1′b01 to disable only the upper nibble, 1′b10 to disable the upper byte (e.g., mode register path disable field setting for third X16 memory device in the 40-bit channel shown in FIG. 3), and 1′b11 to disable the upper three nibbles (e.g., this would be the setting of the third X16 memory device if the memory devices in FIG. 3 were integrated in a 36-bit channel).

In some embodiments, the mode register can include several bits which can indicate, not only whether not to disable certain nibbles, but which nibbles to disable. For example, a 2-bit nibble disable field could indicate 3 different nibble positions to disable (for example 1′b00 could indicate not to disable nibbles, 1′b01 could indicate to disable the upper-three nibble, 1′b10 could indicate to disable the lower-three nibbles, and 1′b11 could indicate to disable the upper and lower nibbles). The ability to select which nibbles to disable can be used, for example, to factor in signal integrity criteria or factory testing results. For example, if certain data bits in the memory device were defective in some way, those could be the nibbles that are selected for disabling. Additionally, to minimize cross-talk and noise injection into adjacent circuits, disabling certain nibbles over others may be preferred. In some embodiments, the choice of nibble to disable is determined by the layout of the memory device 100 in the memory module 210. For example, based on the addressing of the memory devices, the upper byte (e.g., when x16 devices are used) can have the most significant address bits which can correspond to the byte that is selected for disabling (for example, for six X16 DDR5 SDRAMs, data bits DQ[47:40] of each rank of three DRAM can be disabled, leaving DQ[39:0]).

In some embodiments, other methods of disabling nibbles or bytes of the memory device are possible including generating the nibble disable signals from configuration fuses that are blown during factory testing, for example. Additionally, or alternatively, signals tied to constant voltages such as supply or ground (e.g., soldered on the PCB) can be used to determine whether to disable nibbles/bytes and/or what nibbles/bytes to disable.

In some embodiments, the memory device 220a and 220b is a DDR4 or DDR5 SDRAM memory, and the memory module 210 is a small-outline dual in-line memory module (SODIMM), a registered DIMM, or any other single- or dual-channel memory module integrating multiple DDR4 or DDR5 SDRAM memory devices. For dual-channel DDR5 SODIMMs, memory channel 250 could be 0 (S=0 depicted in FIG. 2) or 1 for the zeroth or first channel, respectively.

In some embodiments disabling nibbles or data bytes of the memory devices includes masking, suppressing, or disabling any error alerts that can be generated from the disabled nibbles. For example, when ECC is enabled, because these unused data bits that are not part of the P-bit data bus 240 can have unknown states particularly during refresh, they could trigger erroneous ECC errors, parity errors, or other error states. In these embodiments, those error alerts can either be masked by error mask logic, thereby preventing them from propagating to the memory controller or host, or the error generation logic can be gated so that such errors do not arise in the first place. Additionally, a typical response that would be triggered in response to such error events can be prevented from occurring. For example, where a write CRC error is enabled in the DRAM memory device mode register 118 (in FIG. 1) and the memory device calculates CRC before writing data into the array, a CRC error may cause the memory device to block the write operation and discard the data. Instead, this typical response can be overridden by the error controller 162 (in FIG. 1) in cases where the CRC error is associated with data nibbles disabled by the data path disable circuit 168 (in FIG. 1). In other embodiments, a CRC generator can ignore the disabled nibbles when generating a CRC code associated with the data nibbles and the error controller can ignore the disabled data nibbles when comparing CRC codes thereby avoiding CRC errors associated with the disabled data nibbles. In other embodiments, other methods of disabling the effects or operation of these unused data bits can include disabling refresh to these data terminals, powering down circuits that only relates to these data terminals, latching these data bits to a known state, e.g., to ground or VDDQ, latching the strobe signals, disabling the data mask signal, etc.

Figure 3:
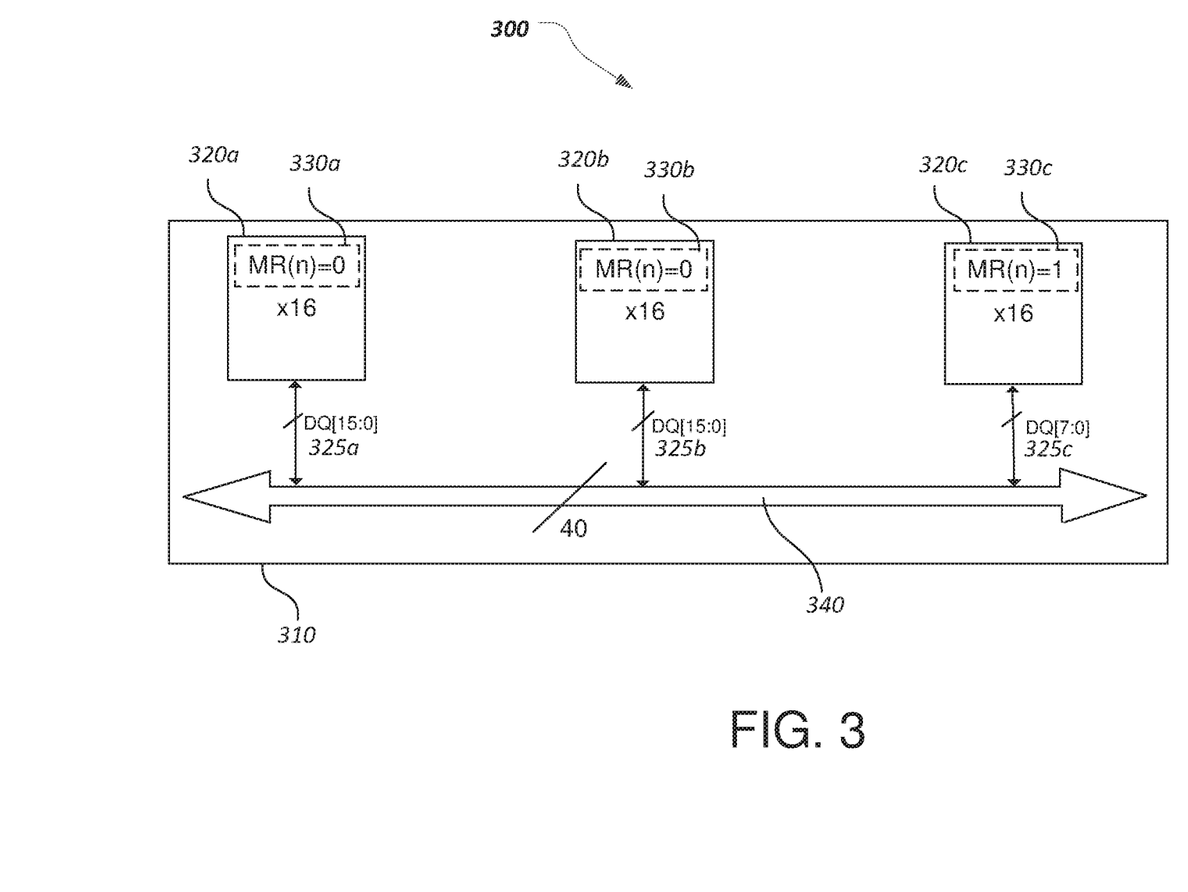
FIG. 3 is a representative block diagram schematically illustrating a channel of x16 memory devices integrated in a memory module.

FIG. 3 is a representative block diagram 300 schematically illustrating a channel of three x16 memory devices 320a, 320b, and 320c integrated in a memory module 310 with ECC enabled. In the example depicted in FIG. 3 showing a 40-bit per channel data bus 340 and three memory devices, where the number of data nibbles in the x16 memory device is four, one data byte (two data nibbles) can be disabled from one of the memory devices (FIG. 3 shows disabling of last memory device 320c). Each of the memory devices 320a and 320b can include a mode register 330a and 330b, respectively, with the nth bit of these mode registers, MR(n), equal to a logic 0. In this example configuration, each of the data terminals (DQ), 325a and 325b, of memory device 320a and 320b (respectively) can be 16 bits (DQ[15:0]). If the third x16 memory device 320c includes a mode register 330c with the nth bit (MR(n)) equal to a logic 1, this can indicate to disable one byte (two nibbles). In this configuration, the data terminal (DQ) 325c of memory device 320c can be 8 bits (DQ[7:0]). A data strobe associated with the disabled upper byte, e.g., DSQU, (not shown in FIG. 3) can also be disabled. A second channel (not shown in FIG. 3) can be similarly configured to yield a 80-bit data bus when combined with the first channel.

Figure 4:
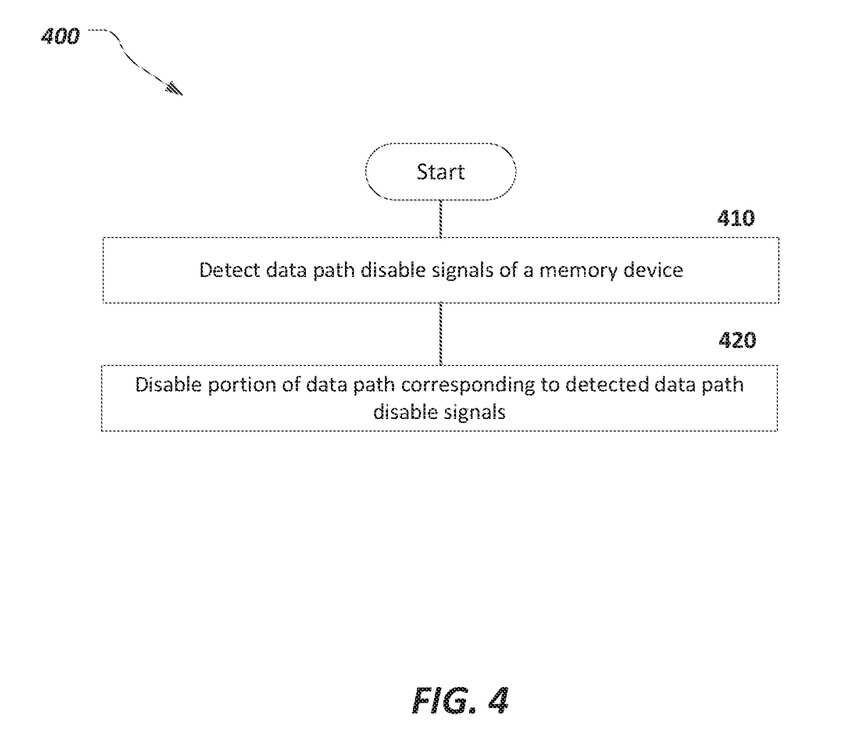
FIGS. 4 and 5 are representative flow diagrams illustrating a method for disabling nibbles of a memory device integrated in a memory module.

FIG. 4 is a representative flow diagram 400 illustrating a method for disabling data bits of a memory device 100 integrated in a memory module 310 in accordance with embodiments herein. This method can be implemented using combination or sequential logic circuits in, for example, data path disable circuit 168 (in FIG. 1), I/O circuit 160 (in FIG. 1), refresh controller 112 (in FIG. 1), and/or error controller 162 (in FIG. 1). At block 410, memory device 100 detects data path disable signals of the memory device 100. As discussed above in relation to FIG. 2, the data path disable signals can be generated from data path disable bits stored in a data path disable field of mode register 118 (in FIG. 1), such as from a single upper-byte-disable bit, one or more nibble-disable bits, or one or more bit-disable bits. For example, the register outputs containing the data path disable bits can be coupled to the input of data path disable circuit 168 (in FIG. 1). In other embodiments, the data path disable signals include other signals such as fuse outputs or static hard-wired signals. Data path disable circuit 168 (in FIG. 1) can read the value of the mode register 118 data path disable field or other data path disable signals on power up (i.e., asynchronously) or the data path disable field or signals can be latched synchronously to a clock of memory device 100.

At block 420, memory device 100 disables a portion of the data path corresponding to the detected path disable signals. For example, if a single data path disable signal is utilized, the polarity of the signal can be used to indicate if to disable one byte of a 16-bit data path. For example, in some embodiments, when the signal is logic high, it can indicate to disable an upper byte of the 16-bit data path and disable the upper byte strobe associated with the disabled byte. In other embodiments, a logic high value of the single path disable signal (or single path disable bit in mode register 118 of FIG. 1) can indicate to disable an upper three nibbles of a 16-bit (4-nibble) data path. In yet other embodiments, multiple path disable signals may be detected at block 410 which can indicate a predetermined combination of data path bits to disable from various positions in the data path. For example, a 3-bit data path disable signal can indicate to disable up to 7 different bit pattern combinations of varied bit lengths; an 8-bit data path disable signal can indicate to disable up to 255 different bit pattern combinations, or can indicate to disable the data path bit corresponding to the bit position of the data path disable signal (e.g., 8'b0000_0000 can indicate not to disable any data path bits, 8'b0000_0001 can indicate to disable the LSB, 8'b1000_0000 can indicate to disable the MSB, 8'B1111_0000 can indicate to disable the upper nibble, etc.). It will be appreciated that different bit coding patterns and optimizations can be employed to map the number and value of the data path disable signals to the number and bit position of the disabled data path disable bits.

At block 420, in addition to disabling the portion of the data path corresponding to the detected data path disable signals, memory device 100 can also mask errors associated with the disabled portion of the data path and can also cause refresh controller 112 (in FIG. 1) to disable a refresh of memory array 150 associated with the disabled data path. For example, data path disable circuit 168 (in FIG. 1) can generate an internal data path disable signal which can be used with combinatorial logic to gate the corresponding data strobes or error alerts (e.g., ALERT, DQ, and DQSU can be logically NOR'd with an internal data path disable signal that is 1'b1 when data path disabling is active). In some embodiments, IO circuit 160 (FIG. 1) can conditionally disable a data strobe (e.g., DQSU/DQSL) when a corresponding data byte is disabled (e.g., if all upper 8 bits are disabled, IO Circuit 160 can also disable DQSU).

Figure 5:
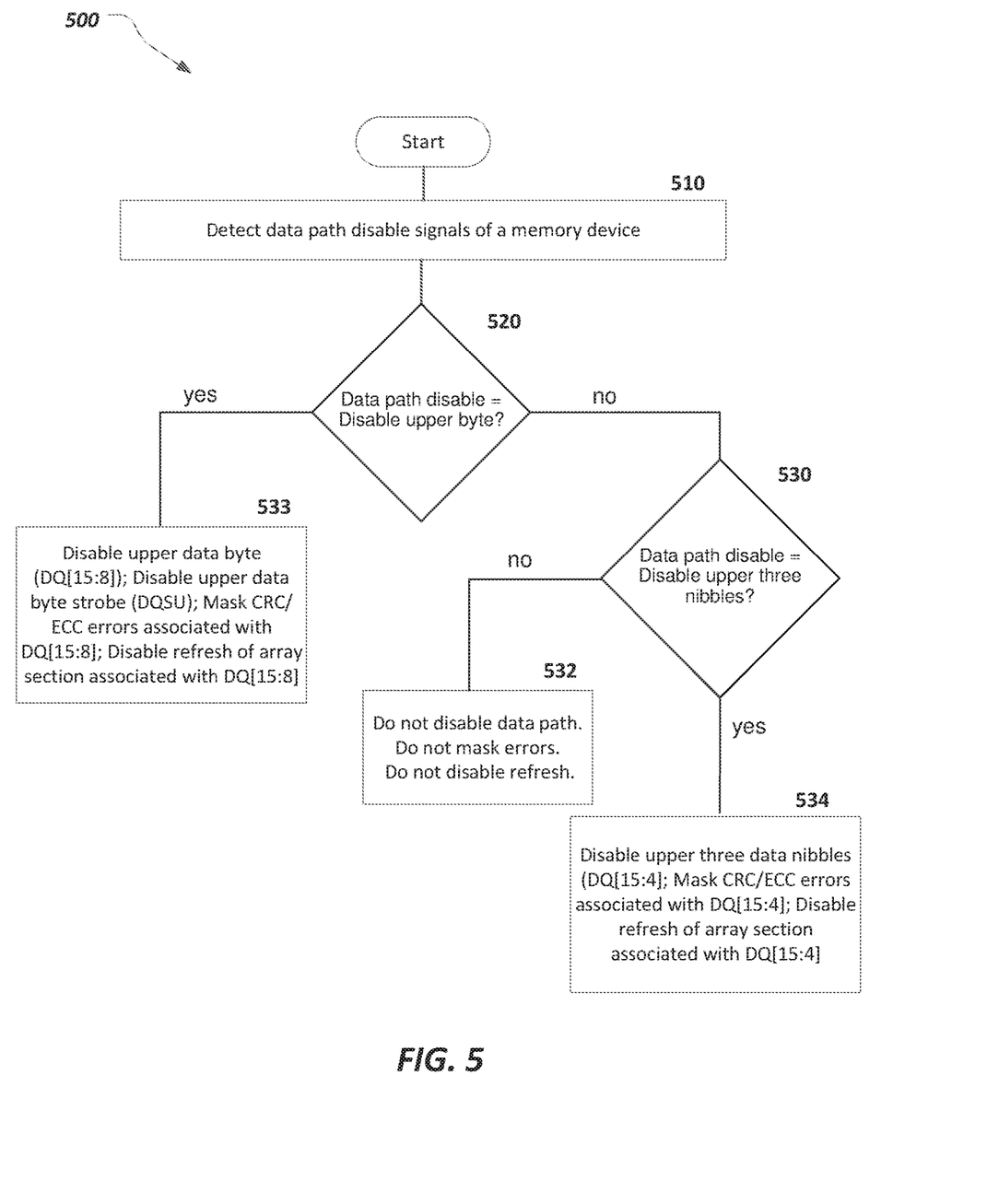

FIG. 5 is a representative flow diagram 500 illustrating a method for disabling data nibbles of a memory device 100 (e.g., a X16 SDRAM) integrated in a memory module 310 (e.g., a DIMM with 40-bit data bus per channel) in accordance with embodiments herein. This method can be implemented using combination or sequential logic circuits in, for example, data path disable circuit 168 (in FIG. 1), I/O circuit 160 (in FIG. 1), refresh controller 112 (in FIG. 1), and/or error controller 162 (in FIG. 1). At block 510, memory device 100 detects data path disable signals of the memory device 100. As discussed above in relation to FIG. 2, the data path disable signals can be generated from data path disable bits stored in a data path disable field of mode register 118 (in FIG. 1), such as from a single upper-byte-disable bit, or one or more upper-three-nibble-disable bits. For example, the register outputs containing the data path disable bits can be coupled to the input of data path disable circuit 168 (in FIG. 1). In other embodiments, the data path disable signals include other signals such as fuse outputs or static hard-wired signals. Data path disable circuit 168 (in FIG. 1) can read the value of the mode register 118 data path disable field or other data path disable signals on power up (i.e., asynchronously) or the data path disable field or signals can be latched synchronously to a clock of memory device 100.

At block 520, memory device 100 determines whether a data path disable signal (e.g., generated from bits in the data path disable field of mode register 118 in FIG. 1) indicates to disable an upper data byte. For example, data path disable circuit 168 (in FIG. 1) can include combinatorial logic to decode the data path disable field bits or the polarity of data path disable signals to determine if the bit/signal pattern corresponds to predefined pattern indicating an upper byte disable mode. That is, at block 510, after memory device 100 receives the data path disable signals it determines the number of signals it receives (e.g., number of bits, or number of signal lines) and detects the polarity of the signals or bits received. Then at block 520 it compares this input received to a set of preconfigured commands or operations. Block 510 and 520 can be part of a digital or analog comparator logic or comparators and muxes where a bit/signal pattern is compared against input values and if it matches a command or operation corresponding to the matched pattern is executed or activated. For example, as discussed above in relation to FIG. 4, part of the received bits or signals can indicate a command or operation to be undertaken or executed by the memory device and the rest of the bits or signals can indicate what bits, nibbles, bytes are to be disabled in response to receiving the inputs. The commands or operations can be, for example, disabling certain bits, disabling certain nibbles, or disabling certain bytes as described further below in relation to blocks 530, 533, and 534.

At block 533, if the data path disable signal indicates to disable an upper data byte, memory device 100 can disable the upper 8 bits of DQ (DQ[15:8]) as well as the upper data byte strobe DQSU. Memory device 100 can also mask errors associated with the disabled data byte and causes refresh controller 112 (in FIG. 1) to disable a refresh of memory array 150 associated with the disabled data byte. For example, data path disable circuit 168 (in FIG. 1) can generate an internal data path disable signal which can be used with combinatorial logic to gate the data strobes or error alerts (e.g., ALERT, DQ, and DQSU can be logically NOR'd with an internal data path disable signal that is 1'b1 when data path disabling is active).

If at block 520, memory device 100 determines that the data path disable signal does not indicate to disable an upper data byte, memory device 100 determines if the data path disable signal indicates to disable an upper three data nibbles at block 530. At block 532, memory device 100 does not disable a portion or mask any errors if it determines that the data path disable signal does not indicate to disable an upper three nibbles. Alternative, at block 534, memory device 100 can disable an upper three data nibbles (DQ[15:4]) if it determines at block 530 that the data path disable signal indicates to disable an upper three nibbles. Memory device 100 can also make CRC/ECC errors associated with the disabled data nibbles, and cause the refresh controller 112 (in FIG. 1) to disable a refresh of memory array 150 associated with the disabled data nibbles.

While the present disclosure contains many representative examples, these should not be construed as limitations on the scope of any disclosed methods or of what can be claimed, but rather as descriptions of features that may be specific to particular embodiments of particular disclosed methods. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendices should not be understood as requiring such separation in all embodiments.

From the foregoing, it will be appreciated that specific embodiments of the present technology have been described herein for purposes of illustration, but that various modifications can be made without deviating from the scope of the technology. Further, while advantages associated with certain embodiments of the technology have been described in the context of those embodiments, other embodiments can also exhibit such advantages, and not all embodiments need necessarily exhibit such advantages to fall within the scope of the present technology. Accordingly, the present disclosure and associated technology can encompass other embodiments not expressly shown or described herein.

I claim:

1. A memory device comprising:
a memory array;
an input/output circuit coupled to the memory array and configured to input or output a plurality of data nibbles based on a plurality of data strobe signals;
a data path disable circuit coupled to the input/output circuit, wherein the data path disable circuit is configured to disable one or more of the plurality of data nibbles based on one or more data path disable signals; and
an error controller configured to generate a cyclic redundancy check (CRC) code based on a plurality of data nibbles that exclude the disabled one or more data nibbles.

2. The memory device of claim 1, wherein the data path disable circuit is configured to disable a data strobe signal when a data byte is disabled.

3. The memory device of claim 1, wherein the one or more data path disable signals comprise a data path disable signal generated from an upper byte disable bit stored in a mode register of the memory device, and wherein, in response to the upper byte disable bit, the data path disable circuit is configured to disable an upper data byte of the plurality of data nibbles and to disable an upper data byte strobe of the plurality of data strobe signals.

4. The memory device of claim 1, wherein the one or more data path disable signals are generated based on at least one of a plurality of bits stored in a mode register of the memory device, a plurality of bits stored in a configuration fuse, an arrangement of one or more signal lines connected to a power or ground potential, or a plurality of signals received from outside the memory device.

5. The memory device of claim 1, further comprising a refresh controller, and wherein the data path disable circuit is further configured to cause the refresh controller to skip a refresh operation on a portion of the memory array associated with the disabled one or more data nibbles.

6. The memory device of claim 1, wherein the data path disable circuit is further configured to cause the error controller to suppress errors associated with the disabled one or more data nibbles.

7. The memory device of claim 6, wherein suppressing errors associated with the disabled one or more data nibbles comprises preventing an error alert generated from an error correcting code (ECC) error associated with the disabled data nibbles from activating.

8. The memory device of claim 6, wherein suppressing errors associated with the disabled one or more data nibbles comprises preventing an error alert generated from a cyclic redundancy check (CRC) error associated with the disabled data nibbles from activating.

9. The memory device of claim 6, wherein suppressing errors associated with the disabled one or more data nibbles comprises ignoring an action triggered in response to an error when the error is associated with the disabled data nibbles.

10. The memory device of claim 9, wherein ignoring an action triggered in response to an error when the error is associated with the disabled one or more data nibbles further comprises overriding a blocked write command to the memory array.

11. A method comprising:
receiving one or more data path disable signals;
determining a number of data path disable signals received;
detecting a polarity of each one of the data path disable signals;
determining if the number and the polarity of the data path disable signals matches one or more of a set of commands or operations,
wherein the set of commands or operations comprises disabling one or more data bits, disabling one or more data nibbles, and disabling one or more data bytes of a memory device;
executing one or more command or operation from the set of commands or operations in response to determining that the number and the polarity of the data path disable signals matches the one or more command or operation; and configuring a cyclic redundancy code (CRC) generator to exclude at least one of the disabled data bits, data nibbles, or data bytes when generating a CRC code.

12. The method of claim 11, wherein the one or more data path disable signals comprise a data path disable signal generated from an upper-byte-disable bit stored in a mode register of the memory device.

13. The method of claim 11, wherein the one or more data path disable signals comprise one or more data path disable signals generated from one or more upper-three-nibble-disable bits stored in a mode register of the memory device.

14. The method of claim 11, further comprising configuring a refresh controller to skip a refresh operation on a portion of the memory array associated with at least one of the disabled data bits, data nibbles, or data bytes.

15. The method of claim 11, further comprising suppressing an error correcting code (ECC) or CRC error associated with at least one of the data bits, data nibbles, or data bytes.

16. The method of claim 15, wherein suppressing the ECC or CRC error further comprises masking an error alert signal generated in response to the ECC or CRC error.

17. A method comprising:

sending, to at least one memory device of a plurality of memory devices of a memory system, a command to disable at least one data bit of the at least one memory device; and disabling the at least one data bit of the at least one memory device in response to detecting the command to disable the at least one data bit; and generating a cyclic redundancy check (CRC) code based on a plurality of data nibbles that exclude the disabled at least one data bit.

18. The method of claim 17, wherein the plurality of memory devices comprise X16 DDR5 SDRAMs and, wherein the method comprises disabling a byte strobe when eight data bits are disabled.

* * * * *